(12) United States Patent
Lee et al.

(10) Patent No.: US 7,713,677 B2
(45) Date of Patent: May 11, 2010

(54) PHOTORESIST COMPOSITION, METHOD OF PATTERNING THIN FILM USING THE SAME, AND METHOD OF MANUFACTURING LIQUID CRYSTAL DISPLAY PANEL USING THE SAME

(75) Inventors: Hi Kuk Lee, Yongin-si (KR); Byung Uk Kim, Hwaseong-si (KR); Hyoc Min Youn, Hwaseong-si (KR); Joo Pyo Yun, Hwaseong-si (KR); Woo Seok Jeon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 417 days.

(21) Appl. No.: 11/562,714

(22) Filed: Nov. 22, 2006

(65) Prior Publication Data

US 2007/0190454 A1 Aug. 16, 2007

(30) Foreign Application Priority Data

Feb. 14, 2006 (KR) .................. 10-2006-0013925

(51) Int. Cl.
*G03F 7/00* (2006.01)
*G03F 7/004* (2006.01)

(52) U.S. Cl. .................... 430/270.1; 430/311; 430/905; 430/913; 430/917; 430/20

(58) Field of Classification Search .............. 430/270.1, 430/311, 905, 913, 917, 20
See application file for complete search history.

(56) References Cited

U.S. PATENT DOCUMENTS

| | | | | |
|---|---|---|---|---|
| 5,912,102 A * | 6/1999 | Kawata et al. | ............... | 430/191 |
| 6,365,321 B1 * | 4/2002 | Chen et al. | ............... | 430/270.1 |
| 6,697,138 B2 * | 2/2004 | Ha et al. | ...................... | 349/114 |
| 2003/0165770 A1 | 9/2003 | Lee et al. | | |

FOREIGN PATENT DOCUMENTS

| KR | 1020030060022 | 7/2003 |
|---|---|---|
| KR | 1020030093049 | 12/2003 |
| KR | 1020050083314 | 8/2005 |

\* cited by examiner

*Primary Examiner*—Amanda C. Walke
(74) *Attorney, Agent, or Firm*—Cantor Colburn LLP

(57) ABSTRACT

A photoresist composition capable of forming a high resolution pattern without an additional heating process includes an alkali-soluble phenol polymer in an amount of 10 to 70 parts by weight, including at least one unit of Formula 1, a photo-acid generator in an amount of 0.5 to 10 parts by weight, a dissolution inhibitor in an amount of 5 to 50 parts by weight, including at least one unit of Formula 2, and a solvent in an amount of 10 to 90 parts by weight, wherein the amounts of the foregoing components is based on a total of 100 parts by weight of alkali-soluble phenol polymer, photo-acid generator, dissolution inhibitor, and solvent, and wherein Formulas 1 and 2 have the structures:

[Formula 1]

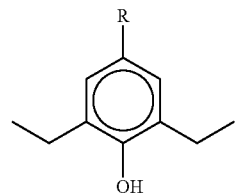

wherein R is a methyl group,

[Formula 2]

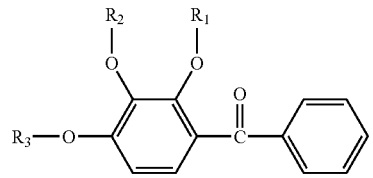

wherein $R_1$, $R_2$ and $R_3$ are the same or different and are hydrogen or t-butyl vinyl ether protective groups.

18 Claims, 4 Drawing Sheets

PHOTORESIST COMPOSITION, METHOD OF PATTERNING THIN FILM USING THE SAME, AND METHOD OF MANUFACTURING LIQUID CRYSTAL DISPLAY PANEL USING THE SAME

This application claims priority to Korean Patent Application No. 2006-0013925, filed on Feb. 14, 2006, and all the benefits accruing therefrom under 35 U.S.C. §119, and the contents of which in its entirety are hereby incorporated by reference.

BACKGROUND OF THE INVENTION

1. Field of the Invention

The present invention relates to a photoresist composition and a thin film patterning method using the same, and more particularly, to a photoresist composition capable of forming a pattern of high resolution without an additional heating process, a thin film patterning method using the same, and a liquid crystal display panel manufacturing method using the same.

2. Description of the Related Art

In recent, various flat panel display devices that can overcome the shortcomings of a cathode ray tube, i.e., which can reduce the thickness and volume thereof, have been developed. The flat panel display device includes a liquid crystal display (LCD), a plasma display panel, a field emission display, and an electro-luminescent display.

The flat panel display device is formed by a plurality of mask processes. One mask process includes a plurality of processes, such as a thin film deposition (or coating) process, a cleaning process, a photolithography process, an etching process, a photoresist stripping process, an inspection process, etc.

A photoresist used for the photolithography process employs a chemically amplified photoresist used in far ultra-violet rays to improve sensitivity and resolution so as to correspond to an LCD device having a trend toward large size, high resolution and high aperture ratio. Such a chemically amplified photoresist is formed as illustrated in FIG. 1 by depositing the chemically amplified photoresist on a substrate, soft-baking the chemically amplified photoresist, and removing a solvent contained in the chemically amplified photoresist. Thereafter, if the chemically amplified photoresist is exposed to light, an acid component is generated from a photo-acid generator contained in the chemically amplified photoresist. The generated acid component decomposes a protective group combined with a backbone of a polymer resin contained in the chemically amplified photoresist by a chain reaction, thereby changing solubility of the photoresist. The exposed photoresist is heated at a given temperature in order to activate and diffuse the acid component generated during the exposure process. The photoresist, after heating, is developed using a developer.

As mentioned above, since the typical chemically amplified photoresist needs an additional heating process in order to activate and diffuse the acid component generated during the exposure process, the process time is increased and equipment and facilities changes are necessary.

SUMMARY OF THE INVENTION

It is therefore an object of the present invention to provide a photoresist composition capable of forming a pattern of high resolution without an additional heating process, a thin film patterning method using the same, and an LCD panel manufacturing method using the same.

In accordance with an aspect of the present invention, there is provided a photoresist composition used in a display device, comprising an alkali-soluble phenol polymer in an amount of 10 to 70 parts by weight, including at least one unit of Formula 1; a photo-acid generator in an amount of 0.5 to 10 parts by weight; a dissolution inhibitor in an amount of 5 to 50 parts by weight, including at least one unit of Formula 2; and a solvent in an amount of 10 to 90 parts by weight, wherein the amounts of the foregoing components is based on a total of 100 parts by weight of alkali-soluble phenol polymer, photo-acid generator, dissolution inhibitor, and solvent, and wherein Formulas 1 and 2 have the following structures:

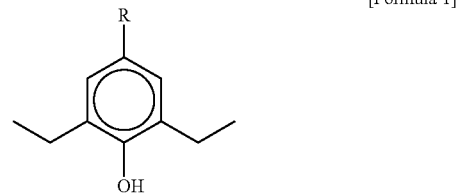

[Formula 1]

wherein R is a methyl group,

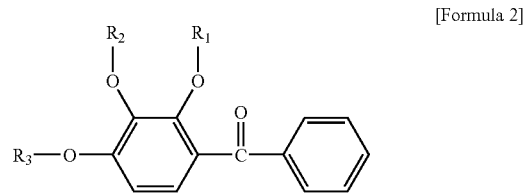

[Formula 2]

wherein $R_1$, $R_2$ and $R_3$ are the same or different and are hydrogen or t-butyl vinyl ether protective groups.

The alkali-soluble phenol polymer is a binder resin that includes a hydroxyl group, and is selected from: an alkali-soluble novolak polymer formed by condensing an aldehyde with a substituted phenol such as ortho-cresol, meta-cresol, para-cresol, 2,4-xylenol, 2,5-xylenol, 3,4-xylenol, 3,5-xylenol, or a mixture comprising at least one of the foregoing; a poly (vinyl phenol), including poly (para-hydroxy-styrene), poly (para-hydroxy-alphamethylstyrene), a copolymer comprising at least one of para-hydroxy-styrene, para-hydroxy-alphamethylstyrene, or acetoxystyrene, an acrylic acid/methacrylic acid copolymer, a hydroxyphenylalkylcarbonyl polymer, a novolak/poly (vinyl phenol) copolymer, or a combination comprising at least one of the foregoing alkali-soluble phenol polymers. The photo-acid generator is selected from a diazonium salt, an onium salt including an iodonium salt and a sulfonium salt, a diazosulfonyl compound, a sulfonyloxyimide, a nitrobenzyl sulfonate ester, a triazine, an oxazole, an oxadiazole, a thiazole, a phenolsulfonic acid ester, a bis-sulfonylmethane, a bis-sulfonyldiazomethane, triphenylsulfonium tris(trifluoromethylsulfonyl) methide, diphenyl iodonium bis(trifluoromethylsulfonyl) imide, or a mixture comprising at least one of the foregoing photo-acid generators.

The dissolution inhibitor is obtained by dissolving trihydroxybenzophenone and t-butyl vinyl ether in acetone and reacting at room temperature in the presence of a base, wherein the conversion of t-butyl vinyl ether to the t-butyl vinyl ether protective group is 60 to 95% as calculated on a per-mole basis.

The photoresist composition further comprises a basic additive (i.e., an additive which acts as a base) for suppressing an undercut phenomenon in an amount of 1 to 9.99 parts by weight based on a total of 100 parts by weight of alkali-soluble phenol polymer, photo-acid generator, dissolution inhibitor, and solvent.

The basic additive is an amine, ammonium hydroxide, a photosensitive base, tetrabutylammonium hydroxide, triethanol amine, diethanol amine, trioctyl amine, n-octyl amine, trimethylsulfonium hydroxide, or triphenylsulfonium hydroxide.

In accordance with another aspect of the present invention, there is provided a method of patterning a thin film, comprising forming the thin film on a substrate, forming on the thin film a photoresist layer comprising a photoresist which includes an alkali-soluble phenol polymer in an amount of 10 to 70 parts by weight and including at least one unit of Formula 1, a photo-acid generator in an amount of 0.5 to 10 parts by weight, a dissolution inhibitor in an amount of 5 to 50 parts by weight and including at least one unit of Formula 2, and a solvent in an amount of 10 to 90 parts by weight, wherein the amounts of the foregoing components is based on a total of 100 parts by weight of alkali-soluble phenol polymer, photo-acid generator, dissolution inhibitor, and solvent; forming a photoresist pattern by patterning the photoresist by exposure and developing processes; and etching the thin film by using the photoresist pattern as a mask.

In accordance with still another aspect of the present invention, there is provided a method of manufacturing an LCD panel, comprising forming a thin film transistor substrate, which includes a thin film transistor so formed as to be connected to a gate line and a data line on a lower substrate, a passivation layer for protecting the thin film transistor, and a pixel electrode connected to the thin film transistor on the passivation layer; and forming a color filter substrate, which includes a black matrix for dividing a pixel region on an upper substrate which faces the lower substrate with liquid crystals disposed therebetween, a color filter formed in the pixel region, and a common electrode for forming an electric field with the pixel electrode; wherein at least one of the thin film transistor, the passivation layer, the pixel electrode, the black matrix, the color filter, and the common electrode is formed by a patterning process using a photoresist which includes an alkali-soluble phenol polymer in an amount of 10 to 70 parts by weight including at least one unit of Formula 1, a photo-acid generator in an amount of 0.5 to 10 parts by weight, a dissolution inhibitor in an amount of 5 to 50 parts by weight, including at least one unit of Formula 2, and a solvent in an amount of 10 to 90 parts by weight, wherein the amounts of the foregoing components is based on a total of 100 parts by weight of alkali-soluble phenol polymer, photo-acid generator, dissolution inhibitor, and solvent.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Figure 1:
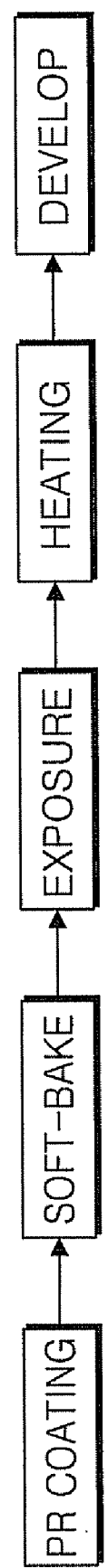
FIG. 1 is a view for describing a conventional photolithography process.

The exemplary embodiments of the present invention will now be described with reference to the attached drawings.

It will be understood in the following disclosure that as used herein, the singular forms "a", "an", and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and combination of the foregoing, but do not preclude the presence and/or addition of one or more other features, integers, steps, operations, elements, components, groups, and combination of the foregoing. As used herein, the term "connected" in reference to electrically conductive elements means both electrically and physically connected either directly or through an intermediate element. Where "connected" is used in reference to a combination of any two elements wherein at least one element is non-electrically conductive, the elements are physically connected either directly or through an intermediate element. As used herein, the term "combination" is inclusive of blends, mixtures, alloys, reaction products, and the like.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

A positive-type photoresist composition according to the present invention includes an alkali-soluble phenol polymer in an amount of 10 to 70 parts by weight, a photo-acid generator in an amount of 0.5 to 10 parts by weight, a dissolution inhibitor in an amount of 5 to 50 parts by weight, and a photoresist solvent in an amount of 10 to 90 parts by weight, wherein the amounts of the foregoing components is based on a total of 100 parts by weight of alkali-soluble phenol polymer, photo-acid generator, dissolution inhibitor, and solvent.

The alkali-soluble phenol polymer is an alkali-soluble phenol polymer binder resin including a hydroxyl group so that it is dissolved in an alkaline solution such as an aqueous alkaline developer and does not dissolve in water at neutral or acidic pH. The alkali-soluble phenol polymer is an alkali-soluble novolak polymer, an alkali-soluble vinylphenol polymer, or a combination comprising at least one of the foregoing alkali-soluble phenol polymers. The alkali-soluble novolak polymer includes at least one unit of Formula 1:

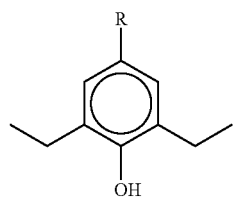

[Formula 1]

The alkali-soluble phenol polymer is a hydroxy-substituted binder resin. The alkali-soluble phenol polymer can be an alkali-soluble novolak resin formed by the condensation of an aldehyde such as formaldehyde with a substituted phenol, where the resulting novolak has high heat resistance and high developability in a basic developer. Exemplary substituted phenols can include, ortho-cresol, meta-cresol, para-cresol, 2,4-xylenol, 2,5-xylenol, 3,4-xylenol, 3,5-xylenol, or a mixture comprising at least one of the foregoing substituted phenols. Alternatively, instead of or in addition to the alkali-soluble novolak polymer, a poly (vinyl phenol) polymer having base developability may be used, such as, for example, poly (para-hydroxy-styrene); poly (para-hydroxy-alphamethylstyrene); copolymers comprising at least one of para-hydroxy-styrene, para-hydroxy-alphamethylstyrene, and acetoxystyrene; an acrylic acid/methacrylic acid copolymer, a hydroxyphenylalkyl carbonyl polymer, or a novolak/poly (vinyl phenol) copolymer. A combination comprising at least one of the foregoing alkali-soluble phenol polymers may also be used.

The photo-acid generator forms acid through an exposure process in which the photo-acid generator is subject to ionizing radiation (typically e.g., x-rays, electron beams, extreme UV radiation, etc) or non-ionizing radiation (typically e.g., ultraviolet radiation) in order to promote a deprotection reaction of the protective groups of the dissolution inhibitor. The photo-acid generator is a diazonium salt, an onium salt including iodonium salt and sulfonium salt, a diazosulfonyl compound, a sulfonyloxyimide, a nitrobenzyl sulfonate ester, and the like. The onium salt includes diphenyliodonium trifluoromethane sulfonate, diphenyliodonium nonafluorobutane sulfonate, triphenylsulfonium trifluoromethane sulfonate, and the like. In addition, a triazine, an oxazole, an oxadiazole, a thiazole, and the like may be used as the photo-acid generator.

Moreover, a phenolsulfonic acid ester, a bis-sulfonylmethane, a bis-sulfonyldiazomethane, triphenylsulfonium tris(trifluoromethylsulfonyl)methide, diphenyl iodonium bis (trifluoromethylsulfonyl)imide, and homologs thereof may be used as the photo-acid generator. Such compounds may be used independently or as a mixture thereof.

The dissolution inhibitor is a hydroxy-substituted aromatic having hydroxy groups protected by base-stable, acid-deprotectable protective groups. When located at a region overlapping a non-exposed part of the mask used during the exposure process, dissolution of the non-exposed region in base solution is suppressed by the dissolution inhibitor. A suitable dissolution inhibitor is a benzophenone compound in which t-butyl vinyl ether protective groups are present. This dissolution inhibitor is an alkali-insoluble compound including at least one unit of Formula 2. In Formula 2, $R_1$, $R_2$ and $R_3$ are the same or different and are hydrogen or t-butyl vinyl ether protective groups.

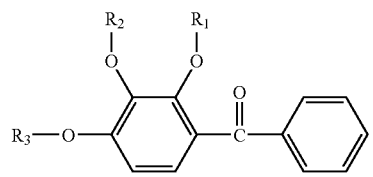

[Formula 2]

The protective groups of the dissolution inhibitor undergo a reaction when exposed to acid generated from the photo-acid generator through the exposure process. Specifically, the dissolution inhibitor, located within a region overlapping an exposed part of a photoresist applied as a layer onto a substrate, and used during the exposure process, deprotects to form the by-products of the protective group and the benzophenone by action of the acid generated through the exposure process. The deprotected compound, e.g., for example, 2,3,4-trihydroxybenzophenone, serves as a small molecule dissolution rate-increasing additive in the exposed photoresist, which accelerates the net dissolution speed of the exposed photoresist.

The dissolution inhibitor can be formed by the reaction of t-butyl vinyl ether and 2,3,4-trihydroxybenzophenone. For example, 2,3,4-trihydroxybenzophenone and t-butyl vinyl ether can be dissolved in acetone and reacted at room temperature in the presence of a base to form an acid-sensitive compound in which the conversion of the t-butyl vinyl ether to the t-butyl vinyl ether protective group is 60 to 95% can be obtained. Specifically, the conversion of t-butyl vinyl ether to the t-butyl vinyl ether protective group is 75 to 85%. If the conversion is less than 75%, a residual film can occur during a subsequent developing process, and if the conversion is greater than 85%, adhesion with a substrate can deteriorate. All conversions of the t-butyl vinyl ether to the t-butyl vinyl ether protective group are calculated on a per-mole basis.

The photoresist solvent can be an alcohol such as methanol and ethanol; an ether such as tetrahydrofuran; a glycol ether such as ethylene glycol monomethyl ether, ethylene glycol monoethyl ether; an ethylene glycol alkyl ether acetate such as methylcellosolve acetate and ethylcellosolve acetate; a diethyleneglycol ether such as diethyleneglycol monomethylether, diethyleneglycol monoethylether, and diethyleneglycol dimethylether; a propyleneglycol monoalkylether such as propyleneglycol methylether, propyleneglycol ethylether, propyleneglycol propylether, and propyleneglycol butylether; a propyleneglycol alkylether acetate such as propyleneglycol methylether acetate, propyleneglycol ethylether acetate, propyleneglycol propylether acetate, and propyleneglycol butylether acetate; a propyleneglycol alkylether propionic acid such as propyleneglycol methylether propionic acid, propyleneglycol ethylether propionic acid, propyleneglycol propylether propionic acid, and propyleneglycol butylether propionic acid; an aromatic hydrocarbon such as toluene and xylene; a ketone such as methylethyl ketone, cyclohexanone, and 4-hydroxy 4-methyl 2-pentanone; and an ester such as methyl acetate, ethyl acetate, propyl acetate, butyl acetate, ethyl 2-hydroxy propionic acid, methyl 2-hydroxy-2-methylpropionic acid, ethyl 2-hydroxy-2-methyl-propionic acid, methyl hydroxy acetate, ethyl hydroxy acetate, butyl hydroxy acetate, methyl lactate, ethyl lactate, propyl lactate, butyl lactate, methyl 3-hydroxy propionic acid, ethyl 3-hydroxy propionic acid, propyl 3-hydroxy propionic acid, butyl 3-hydroxy propionic acid, methyl 2-hydroxy-3-methylbutyrate, methyl methoxyacetate, ethyl methoxyacetate, propyl methoxyacetate, butyl methoxyacetate, methyl ethoxyacetate, ethyl ethoxy acetate, propyl ethoxyacetate, butyl ethoxyacetate, methyl propoxyacetate, ethyl propoxyacetate, propyl propoxyacetate, butyl propoxyacetate, methyl butoxyacetate, ethyl butoxyacetate, propyl butoxyacetate, butyl butoxyacetate, methyl 2-methoxypropionic acid, ethyl 2-methoxypropionic acid, propyl 2-methoxypropionic acid, butyl 2-methoxy propionic acid, methyl 2-ethoxy propionic acid, ethyl 2-ethoxy propionic acid, propyl 2-ethoxy propionic acid, butyl 2-ethoxy propionic acid, methyl 2-butoxy propionic acid, ethyl 2-butoxy propionic acid, propyl 2-butoxy propionic acid, butyl 2-butoxy propionic acid, methyl 3-methoxy propionic acid, ethyl 3-methoxy propionic acid, propyl 3-methoxy propionic acid, butyl 3-methoxy propionic acid, methyl 3-ethoxy propionic acid, ethyl 3-ethoxy propionic acid, propyl 3-ethoxy propionic acid, butyl 3-ethoxy propionic acid, methyl 3-propoxy propionic acid, ethyl 3-propoxy propionic acid, propyl 3-propoxy propionic acid, butyl 3-propoxy propionic acid, methyl 3-butoxy propionic acid, ethyl 3-butoxy propionic acid, propyl 3-butoxy propionic acid, and butyl 3-butoxy propionic acid. It is to select one from a group consisting of a glycol ether, ethylene glycol alkylether acetate, and diethylene glycol, which provide good solubility for each component and which provide good coating characteristics for a film prepared therefrom.

The positive-type photoresist composition according to the present invention may additionally include, in an amount of a few parts, for example, in an amount of 1 to 9.99 parts by weight, at least one of a surface active agent, an additive, a photosensitizer for transferring energy of a specific initial wavelength to a second, different wavelength, and a basic additive for suppressing an undercut phenomenon wherein the lower width of a pattern formed is narrower than the upper width thereof. Where present, the amounts of each of these additives is based on a total of 100 parts by weight of alkali-soluble phenol polymer, photo-acid generator, dissolution inhibitor, and solvent. The basic additive includes an amine, ammonium hydroxide, or photosensitive base. As an example, tetrabutyl ammonium hydroxide, triethanol amine, diethanol amine, trioctyl amine, n-octyl amine, trimethylsulfonium hydroxide, triphenylsulfonium hydroxide, etc. are used as the basic additive.

As described above, according to the positive-type photoresist of the present invention, the protective group is combined with a polyhydroxybenzophenone with strong hydrophilicity in aqueous alkali solution. If the protective group is combined with polyhydroxybenzophenone, which is a small molecule compared to a resin having similar protective groups as used in a conventional positive-type photoresist, the diffusion distance of the photogenerated acid between deprotectable groups becomes shorter than that found in a conventional positive-type photoresist. In addition, when the protective group is derived from a vinyl ether, deprotection can be a lower energy process, and hence more facile, than the de-esterification processes used in some conventional positive tone photoresists employing ester- or carbonate-based protective groups. Thus, the photoresist can be deprotected and developed without an additional heating process after the exposure process that generates the acid (i.e., without a post-exposure bake).

Hereinafter, the present invention is described in more detail through the following examples. It will be understood that the following examples are only for the understanding of the present invention and the scope of the present invention is not limited thereto.

Example 1

100 g of a meta-cresol/formaldehyde novolak resin having a weight average molecular weight of 8,000 (weight average molecular weight Mw/number average molecular weight Mn=1.71), 3.0 g of diphenyliodonium trifluoromethane sulfonate as an onium salt photo-acid generator, 35 g of dissolution inhibitor, 1.0 g of trioctylamine (TOA) as an amine additive, and 400 g of propylene glycol methyl ether propionate as a solvent were added to manufacture the positive-type photoresist.

Example 2

100 g of a meta-cresol/formaldehyde novolak resin having a weight average molecular weight of 8,000 (Mw/Mn=1.71), 3.0 g of diphenyliodonium trifluoromethane sulfonate as an onium salt photo-acid generator, 25 g of dissolution inhibitor, 1.0 g of trioctylamine (TOA) as an amine additive, and 400 g of propylene glycol methyl ether propionate as a solvent were added to manufacture the positive-type photoresist.

Example 3

100 g of a meta-cresol/formaldehyde novolak resin having a weight average molecular weight of 12,000 (Mw/Mn=1.95), 3.0 g of diphenyliodonium trifluoromethane sulfonate as an onium salt photo-acid generator, 30 g of a dissolution inhibitor, 1.0 g of trioctylamine (TOA) as an amine additive, and 400 g of propylene glycol methyl ether propionate as a solvent were added to manufacture the positive-type photoresist.

Example 4

100 g of a meta-cresol/formaldehyde novolak resin having a weight averaged molecular weight of 12,000 (Mw/Mn=1.95), 3.0 g of diphenyliodonium trifluoromethane sulfonate as an onium salt photo-acid generator of onium salt, 25 g of a dissolution inhibitor, 1.0 g of trioctylamine (TOA) as an amine additive, and 400 g of propylene glycol methyl ether propionate as a solvent were added to manufacture the positive-type photoresist.

Comparative Example 1

100 g of a meta-cresol/formaldehyde novolak resin having a weight averaged molecular weight of 8,000 (Mw/Mn=1.71), 25 g of 2,3,4-trihydroxybenzophenone 1,2-naphthoquinone diazido-5-sulfonic acid ester as a photosensitizer, and 400 g of propylene glycol methyl ether propionate as a solvent were added to manufacture the positive-type photoresist.

Comparative Example 2

100 g of a meta-cresol/formaldehyde novolak resin having a weight averaged molecular weight of 12,000 (Mw/Mn=1.95), 25 g of 2,3,4-trihydroxybenzophenone 1,2-naphthoquinone diazido-5-sulfonic acid ester as a photosensitizer, and 400 g of propylene glycol methyl ether propionate as a solvent were added to manufacture the positive-type photoresist.

The photoresist provided by Example 1, Example 2, Example 3, Comparative Example 1, and Comparative Example 2 is coated on a silicon wafer by a spin coating method. Thereafter, the photoresist is subject to a soft baking process, resulting in removing its solvent. The soft baking process is implemented for 60 to 90 seconds at a temperature of 110° C. Ultraviolet rays having an intensity of 15 mW/cm2 emitting from a g, h, i-line broadband aligner using a mercury lamp are irradiated onto the solvent-removed photoresist. The photoresist is dipped for 1 minute into a developer including 2.38% tetramethylammonium hydroxide (TMAH) aqueous solution. Then unnecessary portions of the photoresist are removed, thereby forming a photoresist pattern. Next, the photoresist pattern is cleaned by dipping it into deionized water for 1 minute.

The results obtained by the Examples 1 to 4 and Comparative Examples 1 and 2 are as follows:

TABLE 1

| | Photosensitivity (mJ/cm$^2$) | Retention ratio (%) | Resolution (μm) |
|---|---|---|---|
| Example 1 | 7.0 | 99 | 1.4 |
| Example 2 | 9.1 | 95 | 1.6 |
| Example 3 | 10.1 | 99 | 0.8 |
| Example 4 | 13.5 | 98 | 0.8 |
| Comparative Example 1 | 20.0 | 95 | 3.0 |
| Comparative Example 2 | 29.0 | 98 | 2.0 |

As shown in Table 1, the photoresist produced by Examples 1 to 4 has excellent photosensitivity of 7-10 mJ/cm$^2$ compared with that produced by Comparative Examples 1 and 2. The photoresist produced by Examples 1 to 4 also has excellent resolution of 0.8-1.4 μm compared with that produced by Comparative Examples 1 and 2. In addition, the retention ratio of the photoresist produced by Examples 1 to 4 after exposure and developing processes is high and thus there are few latent images. The resolved images 1:1 of lines and spaces.

Figure 2:
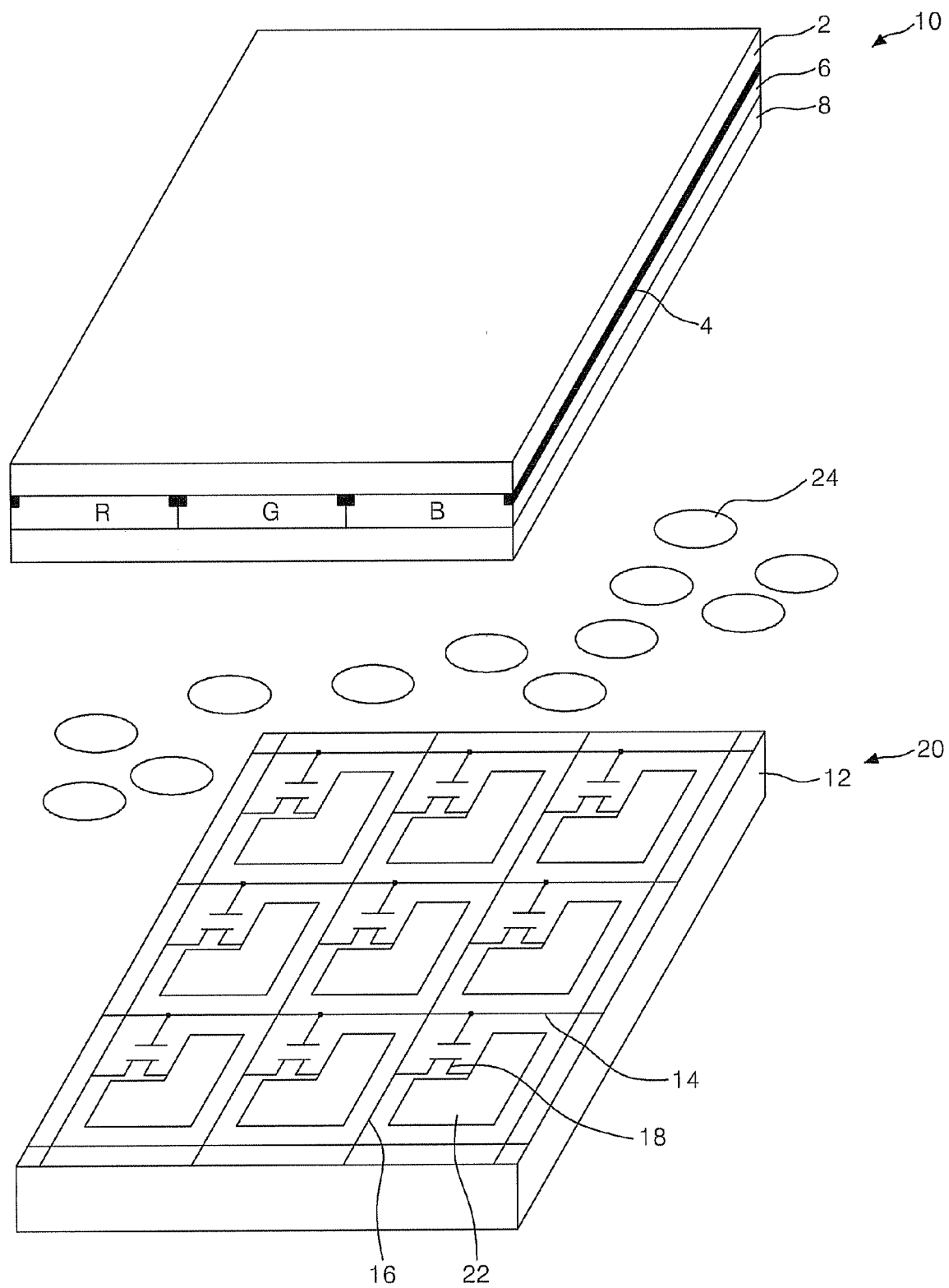
FIG. 2 is a perspective view of an LCD panel formed by a thin film patterning process using a photoresist according to an exemplary embodiment of the present invention.

FIG. 2 illustrates an LCD panel formed by using a thin film patterning method by a photolithography masking process using a photoresist, followed by an etching process.

Referring to FIG. 2, the LCD panel includes a color filter substrate 10, and a thin film transistor (TFT) substrate 20 bonded to the color filter substrate 10 with liquid crystals 24 disposed therebetween.

The color filter substrate 10 includes a black matrix 4, a color filter 6 and a common electrode 8 formed sequentially on an upper substrate 2. The black matrix 4 is formed in a matrix format on the upper substrate 2. The black matrix 4 divides a region of the upper substrate 2 into a plurality of cell regions in which the color filter 6 is formed, and prevents the interference of light between adjacent cells and the reflection of an external light. The color filter 6 is formed in the cell regions divided by the black matrix 4 as red (R), green (G) and blue (B) respectively transmitting R, G and B lights. The common electrode 8 is a transparent conductive layer coated on the whole surface of the color filter 6 and supplies a common voltage that becomes a reference voltage while the liquid crystals 24 are driven.

The TFT substrate 20 includes a TFT 18 and a pixel electrode 22 that are formed in each cell region defined by an intersection of a gate line 14 and a data line 16. The TFT 18 supplies a data signal from the data line 16 to the pixel electrode 22 in response to a gate signal from the gate line 12. The TFT 18 includes a gate electrode connected to the gate line 14, a source electrode connected to the data line 16, a drain electrode connected to the pixel electrode 22, and a semiconductor pattern that forms a channel between the source and drain electrodes and includes an active layer and an ohmic contact layer that overlap the gate electrode with a gate insulating layer disposed therebetween.

The pixel electrode 22 formed of a transparent conductive layer supplies the data signals from the TFT 18 so that the liquid crystals 24 can be driven.

The liquid crystals 24 having dielectric anisotropy control light transmittance by rotating according to an electric field formed by the data signal of the pixel electrode 22 and the common voltage of the common electrode 8, thereby causing gray levels to be represented. The LCD panel further includes a spacer for maintaining a constant cell gap between the color filter substrate 10 and the TFT substrate 20.

Figure 3:
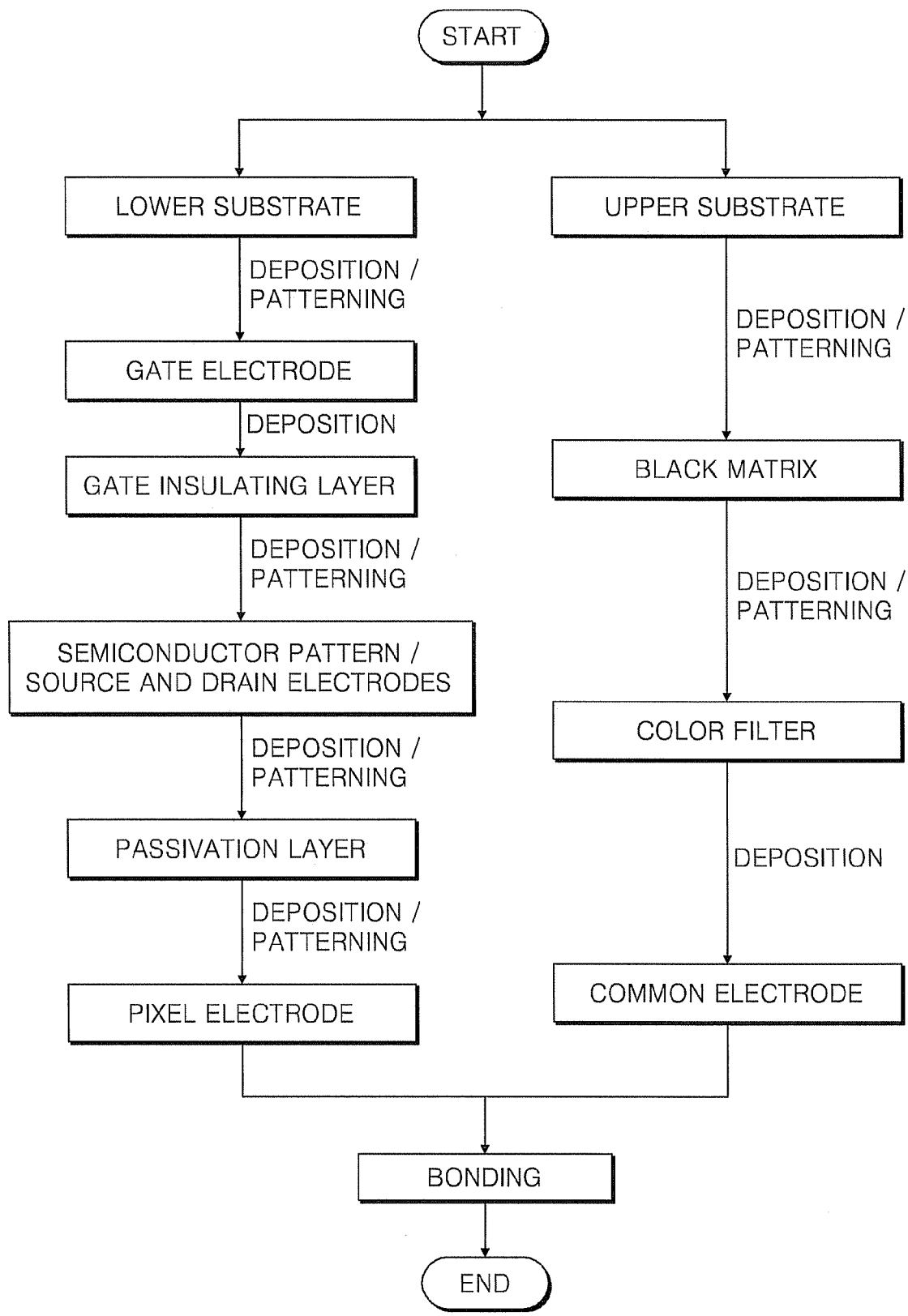
FIG. 3 is a flow chart illustrating a method of manufacturing the LCD panel in FIG. 2.

The color filter substrate 10 and TFT substrate 20 of the LCD panel are formed by a plurality of mask processes as shown in FIG. 3. One mask process includes a plurality of processes, such as a thin film deposition (or coating) process, and a patterning process including a photolithography process and an etching process.

Figure 4:
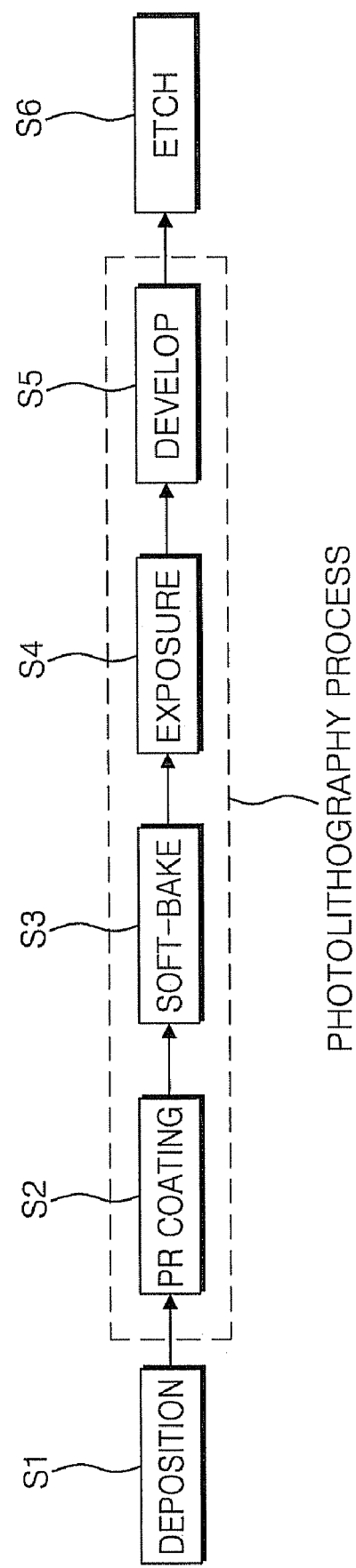
FIG. 4 is a view for describing in detail a patterning process shown in FIG. 3.

Specifically, as shown in FIG. 4, a thin film consisting of one of a metal layer, an insulating layer and a semiconductor layer is formed on a substrate by a deposition (or coating) process (step S1). A photoresist, including an alkali-soluble phenol polymer of 10 to 70 parts by weight including at least one unit of Formula 1, a photo-acid generator in an amount of 0.5 to 10 parts by weight, and a dissolution inhibitor in an amount of 5 to 50 parts by weight including at least one unit consisting of the above Formula 2, and a solvent of 10 to 90 parts by weight, based on a total of 100 parts by weight of alkali-soluble phenol polymer, photo-acid generator, dissolution inhibitor, and solvent, is coated on the substrate by a spray coating, roll coating, spin coating, slit coating, or spin and slit combined coating method (step S2). The photoresist coated on the substrate is subjected to soft baking process, thereby removing the solvent (step S3). The soft baking process is carried out for 1 to 15 minutes at a temperature of 70 to 120° C. A wavelength of 365 to 435 nm is irradiated onto the photoresist of which solvent is removed, by using an ultraviolet exposer (step S4). Thereafter, the photoresist is developed by a dipping, spin, shower, or puddle method using a developer including 2.38% TMAH solution. The development process is carried out for about 50 to 150 seconds. Unnecessary portions of the photoresist are removed by the development process, thereby forming a photoresist pattern (step S5).

By etching the thin film using the photoresist pattern as a mask, a thin film pattern, for example, one of a gate electrode, a semiconductor pattern, source and drain electrodes, a passivation layer, a pixel electrode, a black matrix, a color filter, and a common electrode (step S6), can be provided.

While the photoresist used to pattern a thin film contained in an LCD panel has been described, use of the photoresist can be is applied to the production of another display device such as a plasma display panel, an electro-luminescent display, or a field emission display.

As described above, the photoresist composition according to the present invention includes a dissolution inhibitor for accelerating a dissolution speed at a region overlapping an exposed part of a mask and suppressing dissolution at a region overlapping a non-exposed part thereof. The photoresist composition according to the present invention then increases sensitivity and resolution.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A photoresist composition used in a display device, comprising:
    an alkali-soluble phenol polymer in an amount of 10 to 70 parts by weight, including at least one unit of Formula 1;
    a photo-acid generator in an amount of 0.5 to 10 parts by weight;
    a dissolution inhibitor in an amount of 5 to 50 parts by weight, including at least one unit of Formula 2; and
    a solvent in an amount of 10 to 90 parts by weight,
    wherein the amounts of the foregoing components is based on a total of 100 parts by weight of alkali-soluble phenol polymer, photo-acid generator, dissolution inhibitor, and solvent;

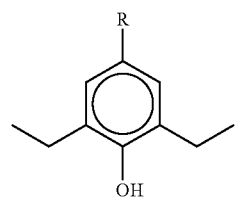

wherein R is a methyl group,

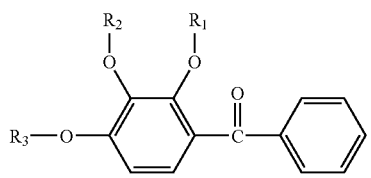

wherein at least one of $R_1$, $R_2$ and $R_3$ is a t-butyl vinyl ether protective group.

2. The photoresist composition according to claim 1, wherein the alkali-soluble phenolic polymer comprises a hydroxyl group, wherein the alkali-soluble phenol polymer comprises: an alkali-soluble novolak formed by condensing an aldehyde with a substituted phenol selected from ortho-cresol, meta-cresol, para-cresol, 2,4-xylenol, 2,5-xylenol, 3,4-xylenol, 3,5-xylenol, or a mixture comprising at least one of the foregoing substituted phenols; a poly (vinyl phenol), including poly (para-hydroxy-styrene), poly (para-hydroxy-alphamethylstyrene), a copolymer comprising at least one of para-hydroxy-styrene, para-hydroxy-alphamethylstyrene, or acetoxystyrene, an acrylic acid/methacrylic acid copolymer, a hydroxyphenylalkylcarbonyl polymer, or a novolak/poly (vinyl phenol) copolymer; or a combination comprising at least one of the foregoing alkali-soluble phenol polymers.

3. The photoresist composition according to claim 1, wherein the photo-acid generator is selected from a diazonium salt, an iodonium salt, a sulfonium salt, a diazosulfonyl compound, a sulfonyloxyimide, a nitrobenzyl sulfonate ester, a triazine, an oxazole, an oxadiazole, a thiazole, a phenolsulfonic acid ester, a bis-sulfonylmethane, a bis-sulfonyldiazomethane, triphenylsulfonium tris (trifluoromethylsulfonyl) methide, diphenyl iodonium bis(trifluoromethylsulfonyl) imide, or a mixture comprising at least one of the foregoing photo-acid generators.

4. The photoresist composition according to claim 1, wherein the dissolution inhibitor is obtained by dissolving trihydroxybenzophenone and t-butyl vinyl ether in acetone and reacting at room temperature in the presence of a base to convert the t-butyl vinyl ether to the t-butyl vinyl ether protective group, wherein the conversion of t-butyl vinyl ether to t-butyl vinyl ether protective group is 60 to 95%, as calculated on a per-mole basis.

5. The photoresist composition according to claim 1, further comprising a basic additive for suppressing an undercut phenomenon in an amount of 1 to 9.99 parts by weight based on a total of 100 parts by weight of alkali-soluble phenol polymer, photo-acid generator, dissolution inhibitor, and solvent.

6. The photoresist composition according to claim 5, wherein the basic additive is an amine, ammonium hydroxide, a photosensitive base, tetrabutyl ammonium hydroxide, triethanol amine, diethanol amine, trioctyl amine, n-octyl amine, trimethylsulfonium hydroxide, or triphenylsulfonium hydroxide.

7. A method of patterning a thin film, comprising:
forming a thin film on a substrate;
forming on the thin film a photoresist layer which includes an alkali-soluble phenol polymer in an amount of 10 to 70 parts by weight including at least one unit of Formula 1, a photo-acid generator in an amount of 0.5 to 10 parts by weight, a dissolution inhibitor in an amount of 5 to 50 parts by weight, including at least one unit of Formula 2, and a solvent in an amount of 10 to 90 parts by weight, wherein the amounts of the foregoing components is based on a total of 100 parts by weight of alkali-soluble phenol polymer, photo-acid generator, dissolution inhibitor, and solvent;
forming a photoresist pattern by patterning the photoresist layer by exposure and developing processes; and
etching the thin film by using the photoresist pattern as a mask;

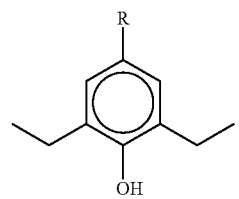

wherein R is a methyl group,

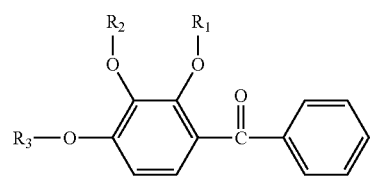

wherein at least one of $R_1$, $R_2$ and $R_3$ is a t-butyl vinyl ether protective group.

8. The method according to claim 7, wherein the alkali-soluble phenol polymer comprises an alkali-soluble phenol polymer binder resin including a hydroxyl group selected from: an alkali-soluble novolak polymer comprising an aldehyde condensed with a substituted phenol including ortho-cresol, meta-cresol, para-cresol, 2,4-xylenol, 2,5-xylenol, 3,4-xylenol, 3,5-xylenol, or a mixture comprising at least one of the foregoing substituted phenols; a poly (vinyl phenol) polymer selected from, poly (para-hydroxy-styrene), poly (para-hydroxy-alphamethylstyrene), a copolymer comprising at least one of para-hydroxy-styrene, para-hydroxy-alphamethylstyrene, or acetoxystyrene, an acrylic acid/methacrylic acid copolymer, a hydroxyphenylalkylcarbonyl polymer, or novolak/poly (vinyl phenol) copolymer; or a combination comprising at least one of the foregoing alkali-soluble phenol polymers.

9. The method according to claim 7, wherein the photo-acid generator is selected from a diazonium salt, an iodonium salt, a sulfonium salt, a diazosulfonyl compound, a sulfonyloxyimide, a nitrobenzyl sulfonate ester, a triazine, an oxazole, an oxadiazole, a thiazole, a phenolsulfonic acid ester, a bis-sulfonylmethane, a bis-sulfonyldiazomethane, triphenylsulfonium tris (trifluoromethylsulfonyl) methide, diphenyl iodonium bis (trifluoromethylsulfonyl) imide, or a mixture comprising at least one of the foregoing photo-acid generators.

10. The method according to claim 7, wherein the dissolution inhibitor is obtained by dissolving trihydroxybenzophenone and t-butyl vinyl ether in acetone and reacting at room temperature in the presence of a base to convert the t-butyl vinyl ether to the t-butyl vinyl ether protective group, wherein the conversion of t-butyl vinyl ether to t-butyl vinyl ether protective group is 60 to 95%, as calculated on a per-mole basis.

11. The method according to any one of claims 7 to 10, wherein the photoresist further includes a basic additive for suppressing an undercut phenomenon in an amount of 1 to 9.99 parts by weight, based on a total of 100 parts by weight of alkali-soluble phenol copolymer, photo-acid generator, dissolution inhibitor, and solvent.

12. The method according to claim 11, wherein the basic additive is an amine, ammonium hydroxide, a photosensitive base, tetrabutyl ammonium hydroxide, triethanol amine, diethanol amine, trioctyl amine, n-octyl amine, trimethylsulfonium hydroxide, or triphenylsulfonium hydroxide.

13. A method of manufacturing a liquid crystal display panel, comprising:
    forming a thin film transistor substrate, including a thin film transistor so formed as to be connected to a gate line and a data line on a lower substrate, a passivation layer for protecting the thin film transistor, and a pixel electrode connected to the thin film transistor on the passivation layer; and
    forming a color filter substrate, wherein the color filter substrate includes a black matrix for dividing a pixel region on an upper substrate which faces the lower substrate with liquid crystals disposed therebetween, a color filter formed in the pixel region, and a common electrode for forming an electric field with the pixel electrode;
    wherein at least one of the thin film transistor, the passivation layer, the pixel electrode, the black matrix, the color filter, and the common electrode is formed by a patterning process using a photoresist which includes an alkali-soluble phenol polymer in an amount of 10 to 70 parts by weight including at least one unit of Formula 1, a photo-acid generator in an amount of 0.5 to 10 parts by weight, a dissolution inhibitor in an amount of 5 to 50 parts by weight and including at least one unit of Formula 2, and a solvent in an amount of 10 to 90 parts by weight, wherein the amounts of the foregoing components is based on a total of 100 parts by weight of alkali-soluble phenol polymer, photo-acid generator, dissolution inhibitor, and solvent, wherein Formulas 1 and 2 have the following structures;

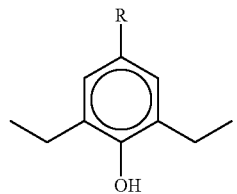

[Formula 1]

wherein R is a methyl group,

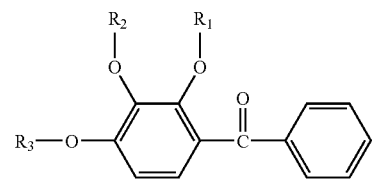

[Formula 2]

wherein at least one of $R_1$, $R_2$ and $R_3$ is a t-butyl vinyl ether protective group.

14. The method according to claim 13, wherein the photoresist further comprises a basic additive for suppressing an undercut phenomenon in an amount of 1 to 9.99 parts by weight based on a total of 100 parts by weight of alkali-soluble phenol polymer, photo-acid generator, dissolution inhibitor, and solvent.

15. The method according to claim 14, wherein the basic additive is an amine, ammonium hydroxide, a photosensitive base, tetrabutyl ammonium hydroxide, triethanol amine, diethanol amine, trioctyl amine, n-octyl amine, trimethylsulfonium hydroxide, or triphenylsulfonium hydroxide.

16. The photoresist composition according to claim 1, wherein $R_1$, $R_2$ and $R_3$ are the same or different and are hydrogen or a t-butyl vinyl ether protective group.

17. The method according to claim 7, wherein $R_1$, $R_2$ and $R_3$ are the same or different and are hydrogen or a t-butyl vinyl ether protective group.

18. The method according to claim 13, wherein $R_1$, $R_2$ and $R_3$ are the same or different and are hydrogen or a t-butyl vinyl ether protective group.

* * * * *